United States Patent
Wieczorek et al.

(10) Patent No.: US 9,891,755 B2
(45) Date of Patent: Feb. 13, 2018

(54) OPERATING DEVICE FOR MOTOR VEHICLES

(71) Applicant: SMR Patents S.à.r.l., Luxembourg (LU)

(72) Inventors: Romeo Wieczorek, Esslingen (DE); Nitesh Shah, Bengaluru (IN)

(73) Assignee: SMR Patents S.à.r.l., Luxembourg (LU)

( * ) Notice: Subject to any disclaimer, the term of this patent is extended or adjusted under 35 U.S.C. 154(b) by 0 days.

(21) Appl. No.: 15/327,152

(22) PCT Filed: Jul. 17, 2015

(86) PCT No.: PCT/IB2015/055440
§ 371 (c)(1),
(2) Date: Jan. 18, 2017

(87) PCT Pub. No.: WO2016/009407
PCT Pub. Date: Jan. 21, 2016

(65) Prior Publication Data
US 2017/0160874 A1      Jun. 8, 2017

(30) Foreign Application Priority Data

Jul. 18, 2014   (EP) .................................... 14177652

(51) Int. Cl.
*G01J 5/02*           (2006.01)
*G06F 3/042*          (2006.01)
(Continued)

(52) U.S. Cl.
CPC .......... *G06F 3/0421* (2013.01); *G01S 7/4812* (2013.01); *G01S 7/4818* (2013.01);
(Continued)

(58) Field of Classification Search
CPC ................. G06F 3/0421; G06F 3/0428; G06F 2203/04109; G02B 6/0028; G02F 1/13338
See application file for complete search history.

(56) References Cited

U.S. PATENT DOCUMENTS 5,938,320 A * 8/1999 Crandall .............. B60Q 1/2665
                                                       362/140
9,170,683 B2 * 10/2015 Drumm ................. G06F 3/0421
(Continued)

FOREIGN PATENT DOCUMENTS

DE      202005010570 U1    9/2005
DE      102007001958 A1 *  7/2008 ............. B60R 1/088
(Continued)

OTHER PUBLICATIONS

International Search Report for PCT/IB2015/055440.
(Continued)

*Primary Examiner* — Kiho Kim
(74) *Attorney, Agent, or Firm* — Jones Day (57) ABSTRACT

An operating device includes at least one ToF sensor for emitting transmission signals, in particular in the form of light, receiving reception signals and outputting information signals, at least one optical waveguide for directing the transmission signals from the ToF sensor to at least one deflection point, for directing the deflection signals deflected where the operating device can be installed in a motor vehicle.

13 Claims, 5 Drawing Sheets

(51) Int. Cl.
    *G01S 7/481*     (2006.01)
    *H03K 17/94*     (2006.01)
    *H03K 17/96*     (2006.01)
    *G01S 17/02*     (2006.01)
    *G01S 17/06*     (2006.01)
    *G01S 17/88*     (2006.01)

(52) U.S. Cl.
    CPC ............ *G01S 17/026* (2013.01); *G01S 17/06* (2013.01); *G01S 17/88* (2013.01); *H03K 17/941* (2013.01); *H03K 17/9638* (2013.01)

(56) References Cited

U.S. PATENT DOCUMENTS

| | | | | |
|---|---|---|---|---|
| 2005/0276057 | A1* | 12/2005 | Takahashi | B60R 1/1207 362/494 |
| 2007/0223250 | A1* | 9/2007 | Chen | G02B 6/0061 362/614 |
| 2010/0053133 | A1* | 3/2010 | Furuta | G02B 6/002 345/207 |
| 2010/0175160 | A1* | 7/2010 | Arnold | A42B 3/226 2/15 |
| 2010/0187422 | A1 | 7/2010 | Kothari | |
| 2010/0321946 | A1* | 12/2010 | Dingman | B60Q 1/2665 362/501 |
| 2011/0025620 | A1 | 2/2011 | Jakobsen | |

FOREIGN PATENT DOCUMENTS

| | | |
|---|---|---|
| DE | 102013000365 A1 | 7/2014 |
| EP | 1898147 A1 | 3/2008 |
| EP | 2662713 A1 | 11/2013 |
| WO | WO 03076870 A1 | 9/2003 |
| WO | WO 2013179168 A1 | 12/2013 |

OTHER PUBLICATIONS

Nritten Opinion of the International Searching Authority for PCT/IB2015/055440.
European Search Report for EP 14177652.

* cited by examiner

OPERATING DEVICE FOR MOTOR VEHICLES

CROSS-REFERENCE TO RELATED APPLICATIONS

This application is a national stage entry of International Patent Application No. PCT/IB2015/055440, filed Jul. 17, 2015, which claims the benefit of priority of European Patent Application No. EP 14177652.6, filed Jul. 18, 2014, the disclosures of each of which is incorporated herein by reference in its entirety.

STATEMENT REGARDING FEDERALLY SPONSORED RESEARCH OR DEVELOPMENT

Not applicable

REFERENCE TO A COMPACT DISK APPENDIX

Not applicable.

BACKGROUND OF THE INVENTION

1. Field of the Invention

The following description relates to an operating device and an inner mirror, an outer mirror and a door of a motor vehicle having such an operating device.

2. Description of Related Art

Optoelectronic sensors are well known, including those which use a ToF (Time-of-Flight) recording to measure distance and which are known either as ToF sensors or PMD (Photonic Mixing Device) sensors. The ToF sensors are used in particular in cameras. The ToF cameras are 3D camera systems which, when a scene is illuminated by means of transmission signals in the form of light pulses, measure the time for each image point which the light needs to travel to an object and back again. The time required is directly proportionate to the distance. The camera thus delivers the distance of the object respectively recorded for each image point. A particular advantage of the ToF camera is that efficient suppression of external light (e.g. sunshine) is achieved, since active transmission signals can be filtered out of ambient light.

An optoelectronic sensor for recording objects in a monitoring area is known from DE 20 2012 102 729 U1. The sensor comprises a light transmitter for transmitting transmission light, a light receiver for generating a receiving signal from the transmission light reflected from the objects in the monitoring area, an evaluation unit for determining information regarding the objects in the monitoring area on the basis of the receiving signal, and an optical element with a first boundary area and a second boundary area, which is arranged in the beam path of the transmission light or of the reflected transmission light in such a manner that at least one portion of the transmission light reaches the monitoring area as detection light.

US 2011/025620 A1 relates to a touch-sensitive device having an optical waveguide in combination with a light source for transmitting transmission signals and a detector field for receiving signals which is separated from the light source. The light rays here travel from the light source via the optical waveguide through deflection at deflection points on the optical waveguide to the detector field.

A touch-sensitive sensor based on an optical waveguide is also known from DE 20 2005 010 570 U1, wherein the light source is arranged on a side of the optical waveguide and a sensor is arranged separately from this on an opposite side of the optical waveguide.

US 2010/0187422 A1 describes an illumination device with a first optical waveguide, having a first planar surface and a second planar surface, at least one light collection feature on the first surface, which can couple light which reaches the first surface into the optical waveguide, and at least one light detector, which is arranged along an edge of the first optical waveguide in order to convert light received by the optical waveguide into a control signal.

A further operating interface with an optical waveguide is known from WO 2013/179168 A1.

ToF sensors can also be used for gesture control e.g. in pivotable inner mirrors for motor vehicles, as is described in EP 14163459, which has not been published. The disadvantage of these is however that the gestures must be known both to the motor vehicle and to the user. It is common in motor vehicles to use touchscreens, which in a disadvantageous manner, however, require expensive technologies such as capacitive surface to trigger functions.

SUMMARY

The object of the present invention is thus to further develop the generic operating device in such a manner that it overcomes the disadvantages of the prior art. In particular, the operating device according to the invention should be designed for use in a motor vehicle, for example in an outer mirror, an inner mirror and/or a door.

This object is attained according to the invention by means of the features of the characteristics of claim 1. Claims 2 to 10 describe preferred embodiments of the operating device according to the invention.

Further, the invention also delivers an inner mirror, an outer mirror and a door of a motor vehicle with an operating device according to the invention. Here, the operating surface should be arranged in a frame of a mirror element and/or adjacent to the mirror element or in a frame of a window and/or adjacent to the window and/or in an illumination module.

The invention is thus based on the surprising finding to combine the advantages of a ToF sensor with its ability for precise distance measurement and the advantages of an optical waveguide with the simplicity of its production and/or processing in order to provide defined deflection points and exit points for light, via which the touch positions can be defined which can be specifically assigned to functions in a motor vehicle. Through the approach e.g. of a finger of a driver of a motor vehicle to such an exit point for light, a reflection of the light from the ToF sensor guided in the optical waveguide occurs, which can be transported back via the optical waveguide to the ToF sensor in order to trigger a function such as blinking, dimming of a mirror, switching on of a warning light, setting an air conditioning system or similar. In other words, through the combination of a ToF sensor with an optical waveguide, if appropriate also a plurality of ToF sensors with one or more optical waveguides or a ToF sensor with several optical waveguides, a type of touchscreen is made available which function without capacitive surface or similar.

Even an optical waveguide can be used which already fulfils a function in the motor vehicle, such as an optical waveguide in a blinker module.

BRIEF DESCRIPTION OF THE SEVERAL VIEWS OF THE DRAWINGS

Further features and advantages of the invention emerge from the description of an exemplary embodiment below with reference to schematic drawings, in which.

DETAILED DESCRIPTION OF THE INVENTION

Figure 1:
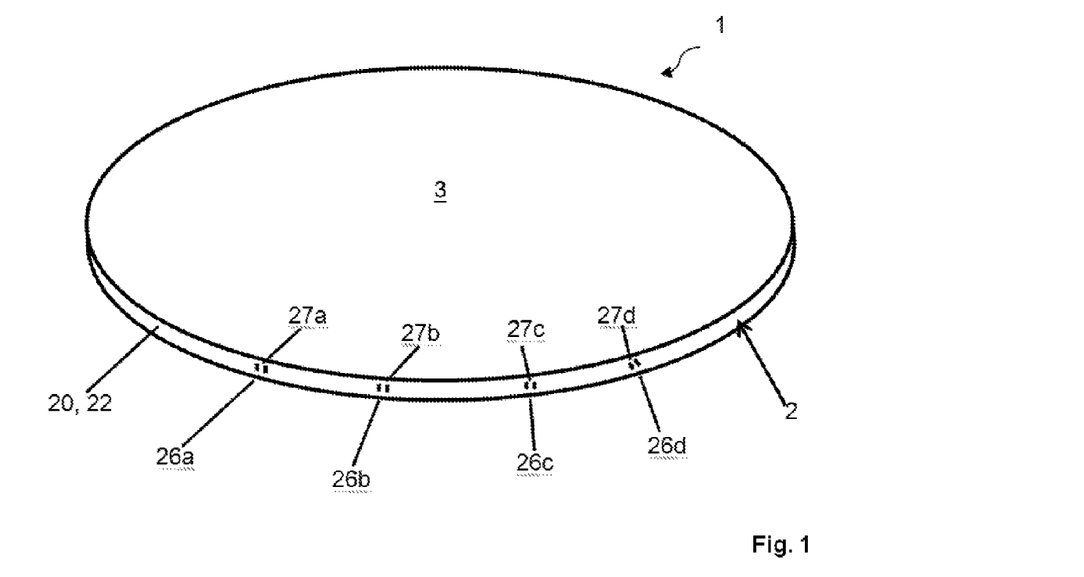
FIG. 1 illustrates a top view onto a portion of a first inner mirror according to the invention.

FIG. 1 shows an inner mirror 1 according to the invention of a motor vehicle (not shown), with an operating device 2 and a mirror element 3. The operating device 2 is arranged below the mirror element 3 in a frame, not shown, of said mirror element and offers an operating surface 22. On the operating surface 22, four keys can be activated to trigger functions within the motor vehicle in which the inner mirror 1 is mounted, wherein each key is formed by a light exit point 26a-26d, and to facilitate identification, in the area of each light exit point 26a-26d, the key is assigned a mark 27a-27d e.g. in the form of a coating of the optical waveguide 20 providing the operating surface 22.

Figure 2:
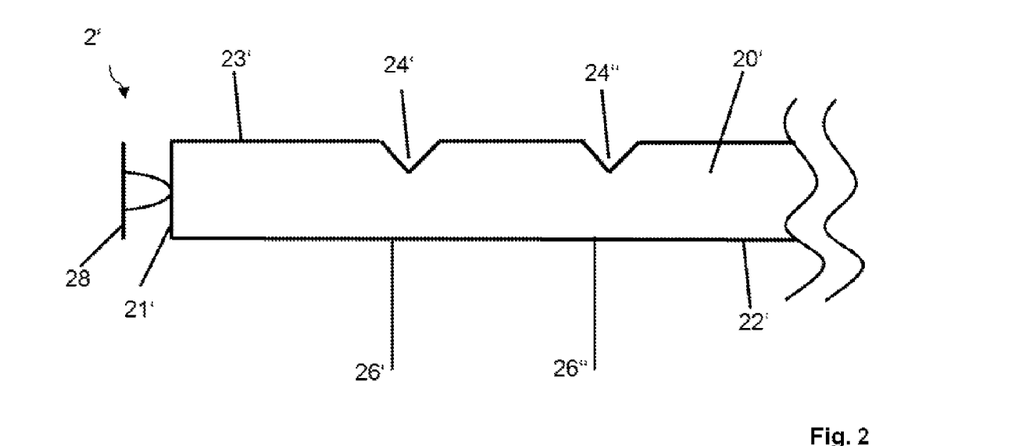
FIG. 2 illustrates a partial profile view through a first operating device according to the invention.

The operating device 2 will now be explained in greater detail with reference to FIG. 2. More precisely, FIG. 2 shows an operating device 2' with an optical waveguide 20', having a light coupling surface 21', an operating surface 22' and a light deflection surface 23'. Light from a ToF sensor 28 can be coupled into the optical waveguide 20' via the light coupling surface 21' in order to spread in the optical waveguide 20'. A part of the light is deflected at light deflection points 24', 24" on the light deflection surface 23', namely in the direction of the light exit point 26', 26" on the operating surface 22'. Here, the operating surface 22' and light deflection surface 23' are essentially parallel to each other and vertical to the light coupling surface 21', wherein this relative arrangement is not mandatory.

Each light deflection point 24', 24" has assigned a light exit point 26', 26". It is however also possible, namely by varying the contour of the light deflection point 24', 24", to assign several light exit points to them. Each light deflection point can be produced by milling out, e.g. in such a manner that the corresponding light exit point provides a defined key point. In order to obtain the same light intensity at the light exit points 26', 26", the second light deflection point 24" should be inserted deeper into the optical waveguide than the first light deflection point 24'. However, the milling out can also be such that a plurality of milling points is provided very close to each other and not very deep, so that via a corresponding plurality of light exit points, a slide control is provided on the operating surface 22'. In fact, through targeted milling out of the optical waveguide 20', a plurality of different light exit points can be produced in a simple manner.

If a finger (not shown) of a driver of the motor vehicle approaches the light exit point 26', wherein the operating device 2' is for example installed adjacent to a mirror element according to FIG. 1, transmission light from the ToF sensor 28, which has been deflected at the light deflection point 24' in the direction of the light exit point 26', is reflected at the finger in order to return back via the optical waveguide 20' as receiving light to the ToF sensor 28 and be evaluated there. For this purpose, the ToF sensor 28 comprises in known manner an evaluation device which is adapted to the respective material of the optical waveguide 20', more precisely to its refraction index, and when the touch of the light exit point 26' is detected, a corresponding information signal is forwarded to a control unit, not shown, of the motor vehicle in order to trigger a function assigned to the light exit point 26', e.g. blinking to the left, while when the light exit point 26" is touched, blinking to the right can be triggered.

In order to better identify the light exit points 26', 26", the optical waveguide 20' can be polished in the corresponding areas. It is also possible for the ToF sensor 28 to transmit visible light, so that the light exit points 26', 26" light up brightly. Furthermore, in the area of the light exit points 26', 26", a coating of the optical waveguide 20' (not shown) can be provided, e.g. in the form of letters "L" and "R" in order to make operation easier for the driver, wherein when the light exit point 26' with the "L" mark is touched, the left blinker is triggered, and when the light exit point 26" with the "R" mark is touched, the right blinker is triggered.

Naturally, the ToF sensor 28 can also operate in the IR range. Then one or more LEDs could additionally be arranged on the side of the light coupling surface 21' to mark the light exit points 26', 26".

With the operating device 2, 2' according to the invention, it is possible to represent a touchscreen in a simple manner, which itself uses optical waveguides already present in a motor vehicle. Thus, the optical waveguide of a blinker can be used as an operating device according to the invention, e.g. in order to lock or open the motor vehicle by touching a specific light exit point. In order to avoid unauthorized use, an operation authorization can in addition be checked prior to opening or locking the motor vehicle. Due to the measurement precision of a ToF sensor it is e.g. possible to evaluate a fingerprint in order to thus permit an authorized user only to trigger a function in a motor vehicle. Instead of evaluating a fingerprint or other biometric recognition, an operating code can however also be stored, such as in the form of the sequence of touch of different light exit points in order to conduct an authentication.

Figure 3:
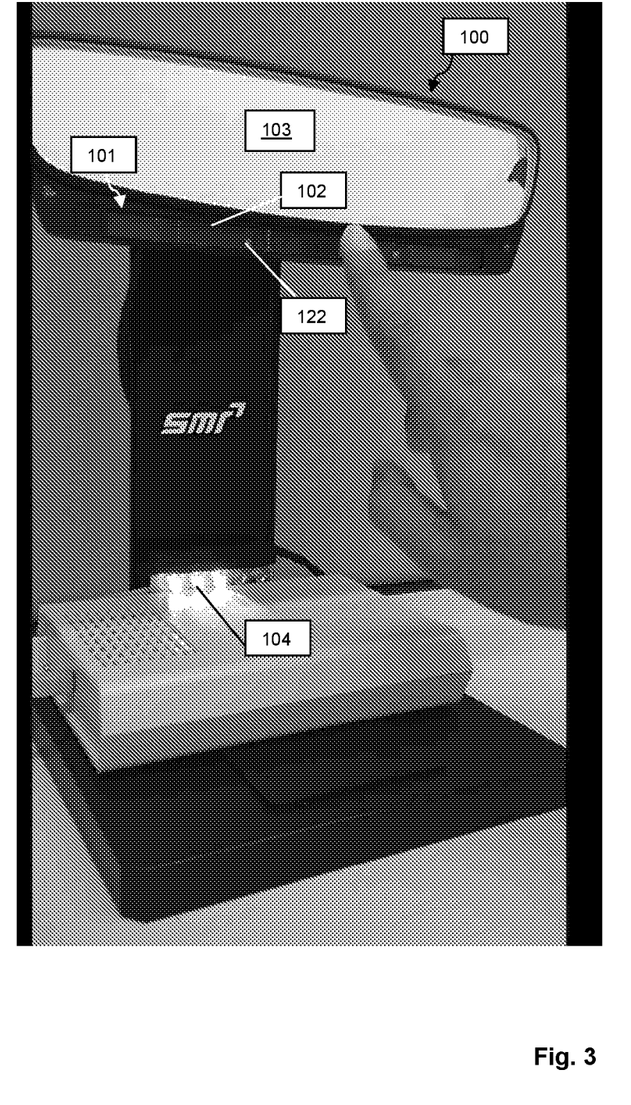
FIG. 3 illustrates a perspective view onto a second inner mirror according to the invention.

FIG. 3 shows a further inner mirror 100 according to the invention, in the form of a test inner mirror. This inner mirror 100 comprises an operating device 101 with five keys 102 adjacent to a mirror element 103, wherein each key 102 is set to switch on or off a control lamp 104 for test purposes, wherein by touching one of the keys 102 in the area of a respective mark 122, a switching procedure is triggered.

For the operating device 101 an optical waveguide can be used which will be described below with reference to FIGS. 4a to 4d.

FIGS. 4a to 4d show an optical waveguide 200 for an operating device according to the invention, which on its left, first end having a light coupling surface 201, which runs with an inclination angle α to a light deflection surface 220 arranged parallel to an operating surface 210. α is e.g. approx. 105°. On the right end of the optical waveguide 200 there is an optical waveguide end surface or light exit surface 202 which has an angle γ of approx. 90° relative to the operating surface 210.

In the light deflection surface 220, five light extraction elements are arranged equidistant from each other in the form of recesses 221, 221A-221E, with the same length respectively along the light deflection surface 220, but with different depths z. The recesses 221, 221A-221E are sawtooth like with a sloping edge, in the area of which light deflection points 222 are provided, and a further edge running essentially vertically to the light deflection surface 220, aside from the furthest right-hand recess 221E. The inclination of the slope comprising the light deflection points 222 is respectively given by an angle β to the light deflection surface 220, which is the same for all recesses 221 and which is preferably approximately 45°. Essential for the slope and thus for the angle β is the guarantee of total reflection of transmission signals as will be described further below in detail with reference to FIG. 4d.

The optical waveguide 200 can be provided in the form of an acrylic glass which only allows light to exit in the area of the light exit surface 202. In order to enable deflected rays to exit from exit points 212, the acrylic glass can be polished in precisely these areas, which represent key areas 211, 211A-211E.

The five recesses 221A-221E in the light deflection surface 220 correspond to five key areas 211A-211E on the operating surface 210. Here, it is preferred that the light intensity is equal in value at the light exit points 212 of each key area 211A-211E.

Figure 4A:
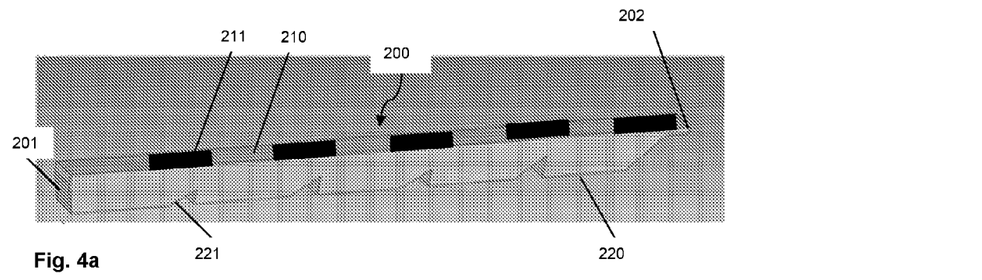
FIGS. 4a, 4b, 4c, and 4d illustrate an optical waveguide for a second operating device according to the invention, in perspective view, in profile view, in profile view with beam path and in partial profile view in combination with a ToF sensor and beam path.
Figure 4B:
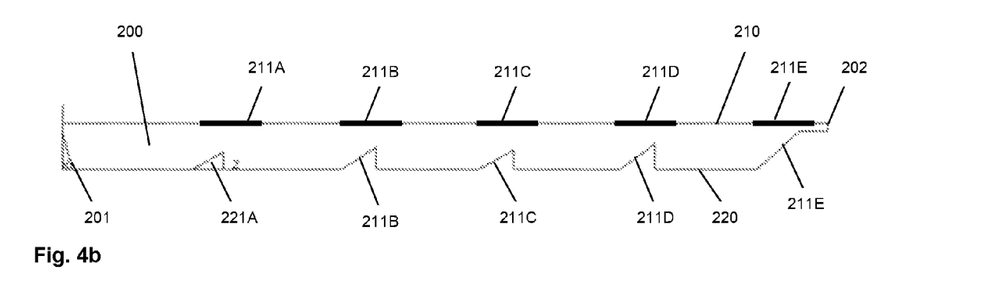
Figure 4C:
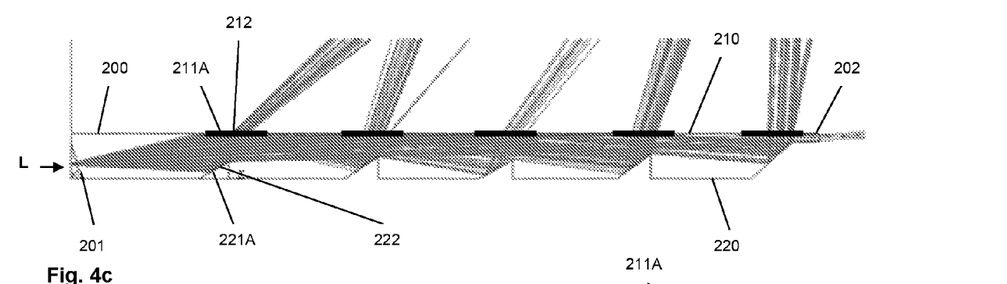
Figure 4D:
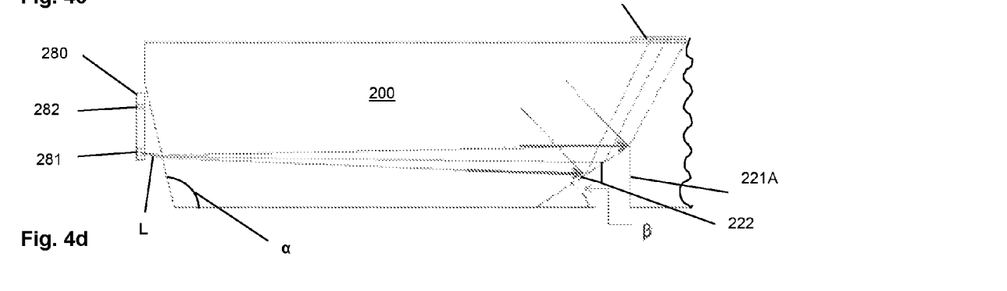

With reference to FIGS. 4c and 4d, the beam path within the optical waveguide 200 is described in greater detail below. Light rays L of a transmitter 281 of a ToF sensor 280 then enter the optical waveguide 200 via the light coupling surface 201 and are reflected within the optical waveguide 200, namely on at least one of the five recesses 221A-221B, namely on a light deflection point 222 respectively, so that light rays of the same intensity exit from the optical waveguide 200 in the five key areas 211A-211E, namely on a light exit point 212 respectively, insofar as no object, in particular a finger, touches at least one of the key areas. According to FIG. 4d, only a single reflection of the transmission signals reaching the first recess 211A occurs, while the transmission signals to all other recesses 221B-221E previously still experience a total reflection on the operating surface 210. A small light quantity also leaves the optical waveguide unreflected on the light exit surface 202.

If a touch, not shown, occurs on one of the key areas 211A-211E, this leads to at least one further reflection, namely on the touch point, which directs light back to the light coupling surface 201. Through this further reflection, reception signals can thus reach a receiver 282 of the ToF sensor 208 and be evaluated there. The ToF sensor 280 enables the determination of the key area which has been touched within the scope of its evaluation, namely due to its ability to calculate distances.

The optical waveguide can be equipped with a reflection layer on the operating surface, namely beyond the key areas, and/or on the light deflection surface, in order to prevent light rays from exiting the optical waveguide in an uncontrolled manner, i.e. beyond the key areas and the light exit surface.

With reference to FIGS. 4a to 4d, recesses 221A-221E are described which are arranged one behind the other in the beam path, which then also lead to key areas 211A-211E which are arranged one behind the other, i.e. sequentially, on the optical waveguide 200. Alternatively and/or cumulatively to this, recesses can also run parallel to each other, so that keys can also be provided that are arranged in parallel. Here, the recesses can be formed in a single optical waveguide or also in several optical waveguides, which are connected to each other if appropriate.

Figure 5A:
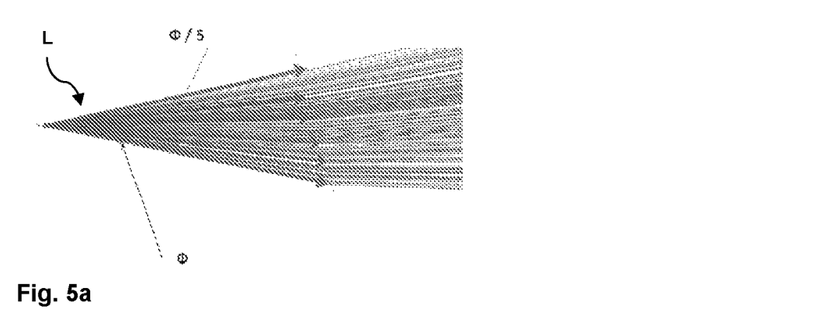
FIGS. 5a and 5b illustrate a light cone such as can be transmitted from the ToF sensor shown in FIG. 4d, respectively in profile view, once in the form of a complete cone and once in the form of two partial cones.
Figure 5B:
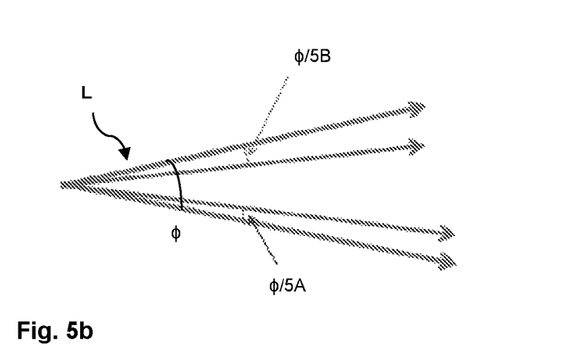

FIG. 5a shows the area of the transmission signals of the transmitter 281 shown in FIG. 4d. The transmission signals can represent light rays L in the infra-red range, namely within a cone φ. This cone φ is divided into five cones φ/5 which are of the same size, of which each is assigned to a recess 221A-221E. FIG. 5b shows two partial cones, for example the cone assigned to the first recess 221A and the cone assigned to the second recess 221B shown in FIG. 4c.

Figure 6A:
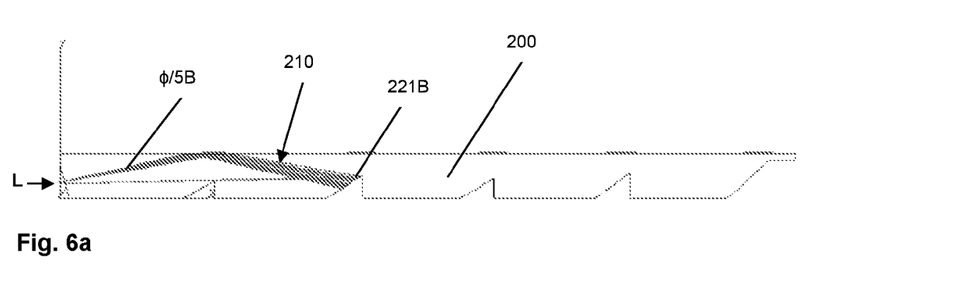
FIGS. 6a and 6b illustrate profile views through two different optical waveguides with different light extraction elements and different beam paths.

FIG. 6a shows the beam path for the transmission signals in the second partial cone φ/5B, which arrives at the operating surface 210 from the sensor 281, experiences a total reflection there in order to reach the second recess 221B.

Figure 6B:
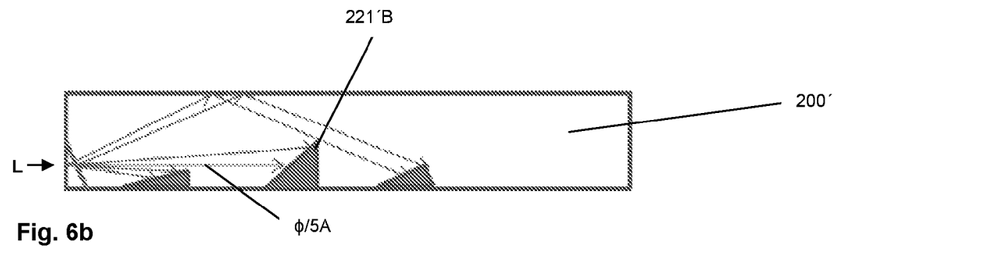

FIG. 6B shows an alternative in which the light extraction elements are provided not in the form of recesses but as material inclusions. Further, here, the second extraction element 221'B is furnished with direct transmission signals from the transmitter 281, i.e. without total reflection on an operating surface. Here, it is also essential that the extraction elements 221'B are designed in such a manner that a total reflection of the transmission signals occurs on their surface.

Figure 7:
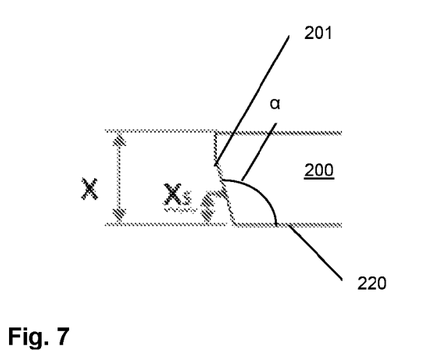
FIG. 7 illustrate a partial profile view through a first end of the optical waveguide shown in FIGS. 4a to 4d.

FIG. 7 shows the first end of the optical waveguide 200 shown in FIGS. 4a-4d with its light coupling surface 201, having an angle α relative to the light deflection surface 220. The angle α, the height x of the optical waveguide 200, the height xs of the transmitter 281 and also the angle β of the recess 221A shown in FIG. 4d should be selected in dependence of each other and also of the refraction index of the material of the optical waveguide 200 depending on the desired light exit points 212.

Figure 8A:
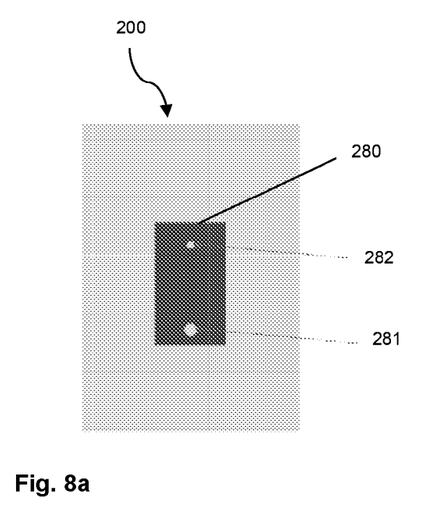
FIGS. 8a and 8b illustrate top views onto a ToF sensor in different relative positions to an optical waveguide, as is described in connection with FIGS. 4a to 4d.
Figure 8B:
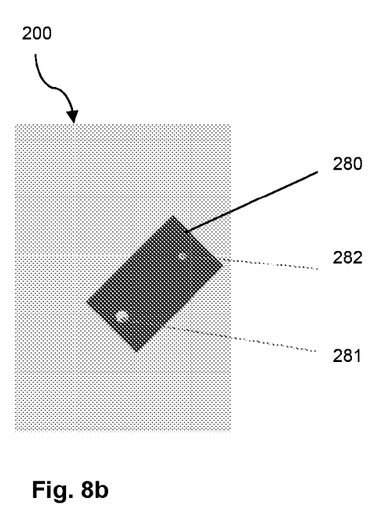

FIGS. 8a and 8b show different relative positions of the ToF sensor 280 to the optical waveguide 200 shown in FIG. 4d, wherein by changing the relative position, the quantity of noise received by the receiver 282 can be minimized.

The optical waveguide can be formed with a fastening device, not shown, for attachment to an inner mirror, an outer mirror or a door, e.g. in the form of a 2K injection molded part.

The features disclosed in the above description, the claims and the drawings can be essential both individually and in any combination for the realization of the invention in its different embodiments.

LIST OF REFERENCE NUMERALS

1 Inner mirror
2, 2' Operating device
3 Mirror element
20, 20' Optical waveguide
21' Light coupling surface
22, 22' Operating surface
23' Light deflection surface
24', 24" Light deflection point 26', 26", 26a-26d Light exit point
27a-27d Mark
28 ToF sensor
100 Inner mirror
101 Operating device
102 Key
103 Mirror element
104 Control lamps
122 Mark
200, 200' Optical waveguide
201 Light coupling surface
202 Light exit surface
210 Operating surface
211, 211A-211E Key area
212 Light exit point
220 Light deflection surface
221, 221A-221E Recess
221'B Light extraction element
280 ToF sensor
281 Transmitter
282 Receiver
222 Light deflection points
L Light beam
x Height of optical waveguide $x_s$
z Depth of recess
α Inclination of light coupling surface
β Inclination of recess
γ Inclination of light exit surface
φ Cone
φ/5, φ/5A, φ/5B Partial cone

The invention claimed is:

1. An operating device, comprising:
   at least one Time-of-Flight (ToF) sensor for emitting transmission signals in the form of light, receiving reception signals, and outputting information signals;
   at least one optical waveguide for guiding the transmission signals from the ToF sensor to at least one deflection point, and guiding deflection signals deflected at the deflection point to at least one assigned exit point acting as an operating element on a first surface of the optical waveguide, the first surface acting as an operating surface, in response to an object, in the form of a finger of a user, approaching the exit point or touching same for guiding reception signals deflected at the object; and
   a control unit, which triggers at least one function assigned to the operating element or the exit point dependent on the information signals outputted by the ToF sensor dependent on the reception signals,
   wherein the operating device can be installed in a motor vehicle,
   wherein the deflection point is provided on a second surface which is opposite to the first surface of the optical waveguide and constitutes a deflection surface of the optical waveguide via an extraction element, and
   wherein the ToF sensor comprises a transmitter for emitting the transmission signals in the beam path before a first end of the optical waveguide having a coupling surface and a receiver for receiving the reception signals when deflection at the exit point also before the first end of the optical waveguide.

2. The operating device according to claim 1, wherein the extraction element reflects transmission signals, by means of total reflection, in the direction of the exit point, which either reach the extraction element directly from the transmitter of the ToF sensor or after deflection, a single reflection, on the first surface of the optical waveguide.

3. The operating device according to claim 2, wherein the extraction element is provided by a recess, in the form of a milled point, in the material of the optical waveguide or via a material inclusion, and wherein via the contour of the extraction element or a coating of said element, the number, location or dimensions of the assigned exit point(s) or the intensity of the deflection signals is or are determined.

4. The operating device according to claim 1, wherein a plurality of extraction elements, deflection points or exit points is provided, or each exit point provides at least a portion of an operating element, in the form of a key or a slide control, or
   each extraction element is assigned an operating element.

5. The operating device according to claim 4, wherein
   each operating element is assigned the same quantity of deflection signals or light intensity, or
   a cone φ of light rays transmitted from the transmitter, which covers an angle area of 12.5 to 60°, essentially has partial cones of equal sizes, of which each is assigned to an extraction element, or
   the deflection signals leave the exit point with an essentially equal angle to the first surface, and vertically to it.

6. The operating device according to claim 1, wherein
   at least one mark in the area of the exit point(s), in the form of a coating, surface processing including polishing or similar or illumination of the optical waveguide, and
   for illumination purposes, visible light can be transmitted along the beam path of the transmission signals of the transmitter, when an object approaches, such as in the form of a finger of a user or with greater intensity when registering a touch of at least one operating element by the object.

7. The operating device according to claim 1, wherein
   a fastening device for attachment in the motor vehicle, or in an inner mirror, an outer mirror, a fittings cover or a door of the motor vehicle, and
   the fastening device is molded as a single piece with the optical waveguide, and in a 2K injection molded part.

8. The operating device according to claim 1, wherein the optical waveguide is part of an illumination module of the motor vehicle.

9. The operating device according to claim 1, wherein the transmission and reception signals lie in the range of infrared or visible light.

10. The operating device according to claim 1, wherein
    at least two coupling surfaces are provided which are respectively assigned at least one extraction element, at least one deflection point or at least one exit point, and
    the coupling surfaces are assigned to one or more optical waveguides, or one or more ToF sensors are assigned to the coupling surfaces.

11. An inner mirror of a motor vehicle having an operating device according to claim 1, wherein the operating surface is arranged in a frame of a mirror element or adjacent to the mirror element or in an illumination module of the inner mirror, for an adjusting or dimming of the inner mirror, adjusting of at least one outer mirror, opening of at least one window, setting an air conditioning system, or switching a warning signal.

12. An outer mirror of a motor vehicle having an operating device according to claim 1, wherein the operating surface is arranged in a frame of a mirror element or adjacent to the mirror element or in an illumination module of the outer mirror, in the form of a blinker module.

13. A door of a motor vehicle having an operating device according to claim 1, wherein the operating surface is arranged in a frame of a window or adjacent to the window or in an illumination module of the door, for an adjusting or dimming of the inner mirror, adjusting of at least one outer mirror, opening of at least one window, setting an air conditioning system, or switching a warning signal.

* * * * *